United States Patent [19]

Strobel et al.

[11] 4,248,316
[45] Feb. 3, 1981

[54] ERROR DETECTING APPARATUS FOR A SCALE HAVING A DIGITAL DISPLAY

[75] Inventors: Felix Strobel, Greifensee; Willi Kunz, Zurich, both of Switzerland

[73] Assignee: Mettler Instruments AG, Greifensee-Zurich, Switzerland

[21] Appl. No.: 82,279

[22] Filed: Oct. 5, 1979

[30] Foreign Application Priority Data

Apr. 4, 1979 [CH] Switzerland .......................... 3119/79

[51] Int. Cl.³ .......................... G01G 19/52; G01G 3/14
[52] U.S. Cl. .......................... 177/50; 177/210 FP; 177/DIG. 3; 364/567
[58] Field of Search ............ 177/50, 210 FP, DIG. 3, 177/25; 364/567

[56] References Cited
U.S. PATENT DOCUMENTS

| | | | |
|---|---|---|---|
| 3,766,472 | 10/1973 | Whitney | 177/210 FP X |
| 4,080,657 | 3/1978 | Caldicott et al. | 364/567 |
| 4,139,069 | 2/1979 | Domis et al. | 177/50 X |
| 4,144,943 | 3/1979 | Gallo | 177/50 X |
| 4,153,122 | 5/1979 | Engels et al. | 177/210 FP X |

*Primary Examiner*—George H. Miller, Jr.
*Attorney, Agent, or Firm*—Marianne Rich

[57] ABSTRACT

In a scale wherein the signal signifying the weight is generated by counting of clock pulses over a weight-dependent part of a predetermined time interval, a second counter counts clock pulses in the remaining part of the predetermined time interval. These are added to the clock pulses counted during the weight-dependent part of the predetermined time interval and compared to a reference number which represents the total number of clock pulses in the predetermined time interval. An error signal is furnished if the two numbers do not correspond.

5 Claims, 4 Drawing Figures

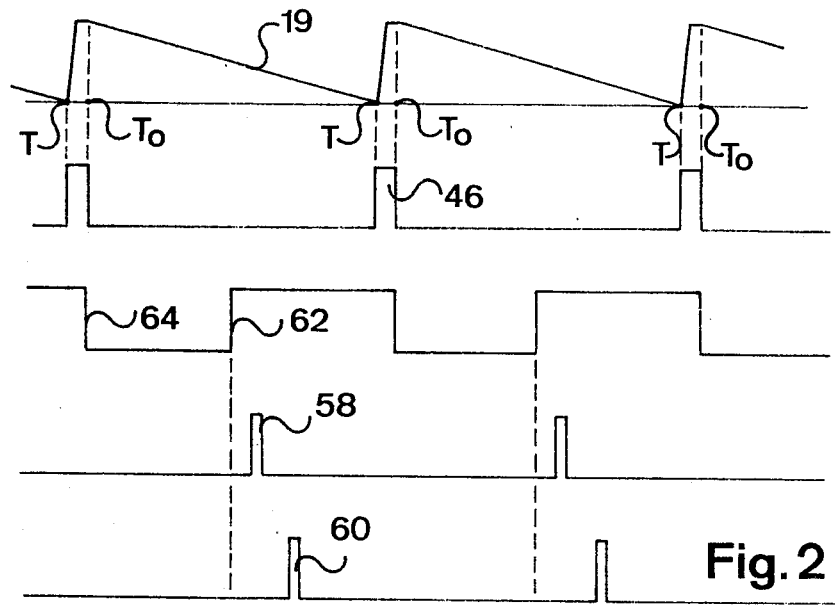
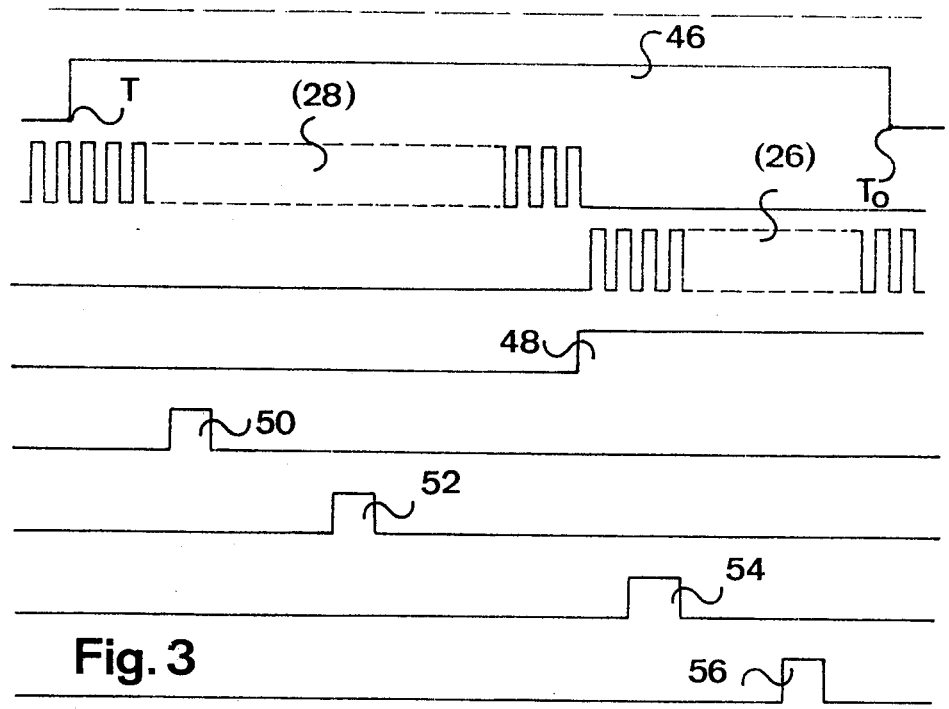
Fig. 2
Fig. 3

ERROR DETECTING APPARATUS FOR A SCALE HAVING A DIGITAL DISPLAY

Cross-reference to related applications and publications

U.S. Pat. No. 3,786,884;
U.S. Pat. No. 3,816,156.

The present invention relates to scales having digital displays. In particular, it relates to scales having a clock frequency generator and a counter which counts the clock signals during weight-dependent parts of predetermined time intervals. The count on the counter, which is proportional to weight, is stored and displayed in a digital display.

BACKGROUND AND PRIOR ART

A scale of the above-described type is disclosed in U.S. Pat. No. 3,786,884. The scale operates with electromagnetic load compensation, that is a compensating current derived from a constant current source is applied to the compensation system during weight-dependent parts of predetermined time intervals. During these weight-dependent parts of the predetermined time intervals, a counter counts high frequency clock pulses, so that the count on the counter at the end of the weight-dependent part of the predetermined time interval corresponds to the weight of the load on the scale.

In this type of scale, the problem of error detection often arises, that is the user of the scale should be made aware by either a visual or an acoustic indication that a malfunction affecting his results may be occurring. In known equipment error detection is accomplished by doubling the number of certain critical components or groups of components, i.e. by providing two parallel channels so that critical intermediate and all end results are made available twice. If the two results agree, there is a very high probability that the equipment is functioning properly.

SUMMARY OF THE INVENTION

It is an object of the present invention to furnish an error detecting system for scales which have a digital display. In particular, correct functioning of the counter is to be checked.

The error detecting system of the present invention is suitable for use in a scale of the above-described type, namely a scale which has a digital display and which further has a clock signal generator and a counter which counts the clock signals during a weight-dependent part of a predetermined time interval, the so-counted number of clock signals constituting a weight signal. The error-detecting system of the present invention comprises means connected to the clock signal generator and the counter for adding the number of pulses generated in the remainder of the predetermined time interval to the weight signal, thereby creating a sum signal. It further comprises means for comparing the sum signal to a reference signal corresponding to the predetermined number of clock signals in the predetermined time interval. Finally means, such as a lamp, are provided for furnishing an error signal when the sum signal is unequal to the reference signal. The adding means may be embodied in various arrangements. For example, the adding means may comprise control means which cause the clock signals during the remaining part of the predetermined time interval to be applied to the same counter which furnishes the weight-dependent signal. Care must, of course, be taken that storing of the weight signal takes place prior to the addition of the clock pulses in the remainder of the predetermined time interval. Thus, the storing of the weight signal must take place between two adjacent clock pulses or, if it takes place at the clock pulse following the weight-dependent part of the predetermined time interval, the reference signal or reference number to which the sum signal or number is compared must be adjusted correspondingly. Alternatively, the counter can be reset following storing of the weight signal, then receive the clock pulses for the remaining part of the predetermined time interval and the contents of the storage can then be added to the counter contents to form the sum signal. As a third alternative, it is of course possible to provide a separate counter for counting the clock signals in the remainder of the predetermined time interval. The adding means would then include this additional counter, and an actual adder as, for example, present in a central processing unit of a microcomputer, can be used to form the sum and to compare the sum to the reference value which, for example, would be stored in a read-only memory (ROM). Of course the adder and comparator can be constructed of well known discreet components. In this case it would be possible to provide a timing counter which counts all pulses throughout the predetermined time interval. The count on this counter would then be used for comparison to the sum signal.

The novel features which are considered as characteristic for the invention are set forth in particular in the appended claims. The invention itself, however, both as to its construction and its method of operation, together with additional objects and advantages thereof will best be understood from the following description of specific embodiments when read in connection with the accompanying drawing.

FIG. 2 is a set of voltage vs. time diagrams of signals at different points in the circuit of FIG. 1;

FIG. 3 is a set of voltage vs. time diagrams for a selected part of the timing diagrams of FIG. 2 on an enlarged scale.

DESCRIPTION OF THE PREFERRED EMBODIMENT

Figure 1:
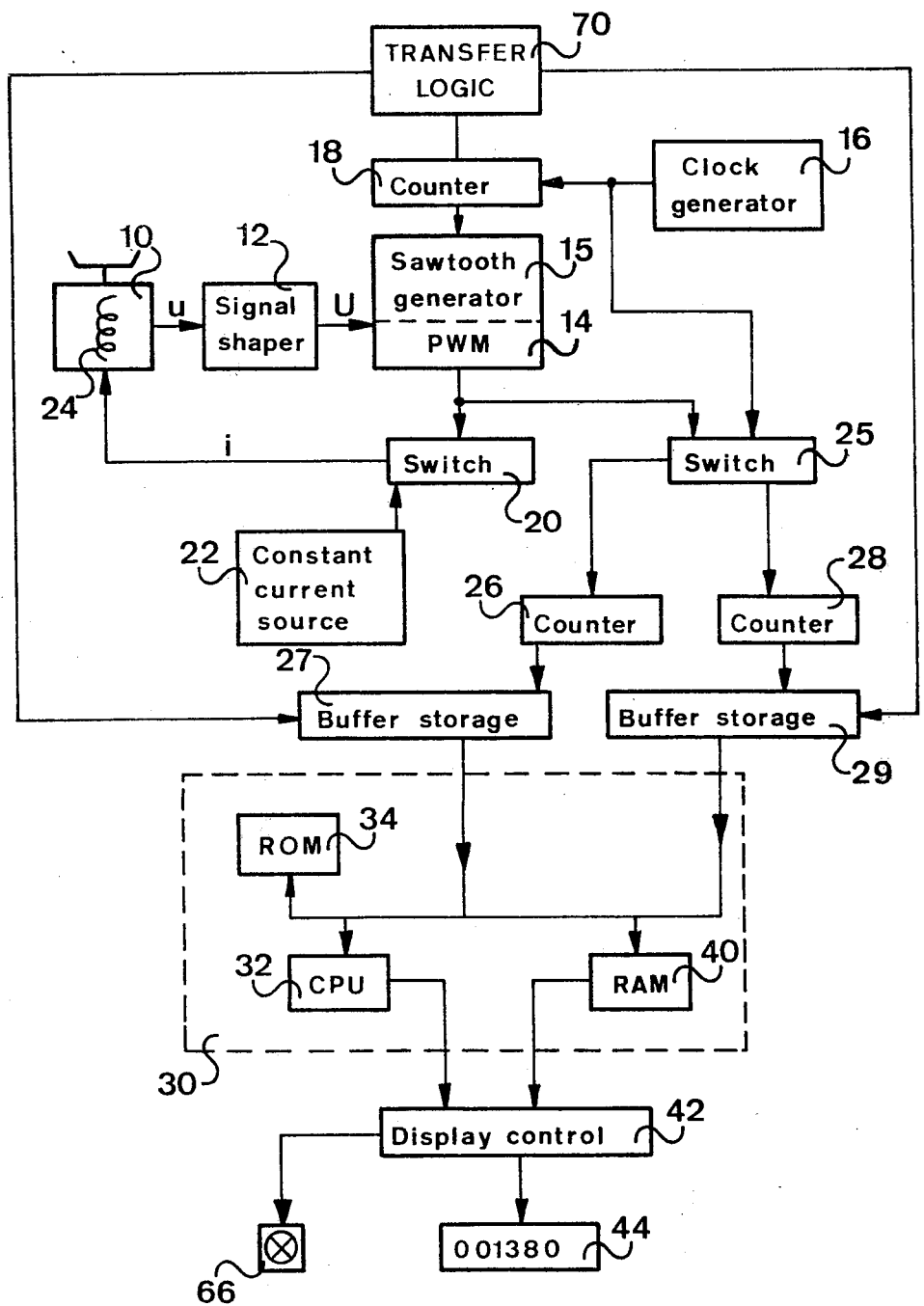
FIG. 1 is a block diagram of a system of the present invention interconnected with a scale having a digital display.

As mentioned above, the present invention will be illustrated in conjunction with a scale having electromagnetic load compensation, as, for example, described in U.S. Pat. Nos. 3,786,884 and 3,816,156.

This scale operates as follows:

Scale 10 receives the load to be weighed on its pan and the excursion resulting therefrom is sensed and a corresponding voltage u is applied to a signal shaping and amplifier circuit 12 which furnishes an output voltage U. This output voltage is applied to one input of a pulse width modulator 14. A clock signal generator 16 furnishes clock pulses at a frequency of 2.46 MHz. These pulses are counted by a counter 18 which controls pulse width modulator 14 via sawtooth generator 15. Specifically, after counter 18 has counted 4,096 clock pulses, it triggers sawtooth generator 15 so that a new sawtooth is generated. Almost simultaneously, an electronic switch 20 connects a constant current source 22 to the compensation system (coil 24) of the scale. When the sawtooth voltage generated by sawtooth generator 15 reaches the value U, pulse width modulator 14 furnishes a signal which switches switch 20 to an open state, that is constant current source 22 is cut off from coil 24. The period of each sawtooth furnished by sawtooth generator 15 thus constitutes a predetermined time interval which comprises a weight-dependent interval (current i is applied to the compensation system) and a remaining part of the time interval, wherein current i is blocked from the compensation system. This operation is the operation of the known scale.

In accordance with the present invention, a switch 25 is provided. This switch is also controlled by the output of pulse width modulator 14, so that clock pulses from clock pulse generator 16 are applied to the weight-dependent interval counter 26 while the current i is being applied to the compensation system and are applied to counter 28 which counts the pulses during the remainder of the predetermined time interval while the current i is blocked from the compensation system. Counters 26 and 28 are herein referred to as second and third counting means, respectively. The contents of counter 26 are transferred to a buffer storage 27 and those of counter 28 to a buffer storage 29. These transfers and the resetting of the counters will be discussed in greater detail below.

Also shown in FIG. 1 is a microcomputer 30 which includes a central processing unit 32, a read-only memory 34 and a random access memory 40. The values to be displayed in the digital display 44 are stored in at least one predetermined storage location in random access memory 40 and, after processing in display control 42 (e.g. conversion from a binary to a decimal code) are displayed on the digital display 44.

The operation of the system will be explained in greater detail with reference to FIGS. 2 and 3. The top curve in FIG. 2 shows the periodic sawtooth voltage 19 which has a period of 1.66 ms. Sawtooth generator 15 is reset to its starting voltage at time T. The ramp-like trailing edge of sawtooth 19 starts at a time $T_o$, 12.8 $\mu$s following time T. This time interval of 12.8 $\mu$s is shown on an enlarged scale in FIG. 3 together with some other significant signals. The time interval from T to $T_o$ is indicated by reference numeral 46. At a time following time T, namely at the time of a leading edge 48 of a pulse representing a predetermined count on counter 18, compensation current is applied to the compensation system of the scale and switch 25 starts the application of clock pulses to counter 26. Shortly before this, the count on counter 26 was transferred to buffer storage 27 in response to a pulse 50 and counter 26 was reset to zero in response to a pulse 52. After counter 26 has started counting, the contents of counter 28 are transferred to buffer storage 29 in response to a pulse 54 and counter 28 is reset in response to a pulse 56. The transfer of the contents of the counters into the buffer storages and the subsequent resetting of the counters should take place as close to the start of the sawtooth as possible so that as much of the sawtooth as possible will be available for changing load conditions.

The lower curves in FIG. 2 show the transfer of the contents of buffer storages 27 and 29 into microcomputer 30. Transfer logic 70 of FIG. 1, besides furnishing pulses 50, 52, 54 and 56, furnishes a sequence of pulses having leading edges 62 and trailing edges 64. The transfer logic in its simplest form comprises a plurality of AND gates each furnishing an output signal when the count on counter 18 reaches a particular number, and a plurality of flip-flops, each set and reset in response to appropriate ones of the AND gate output signals.

Figure 4:
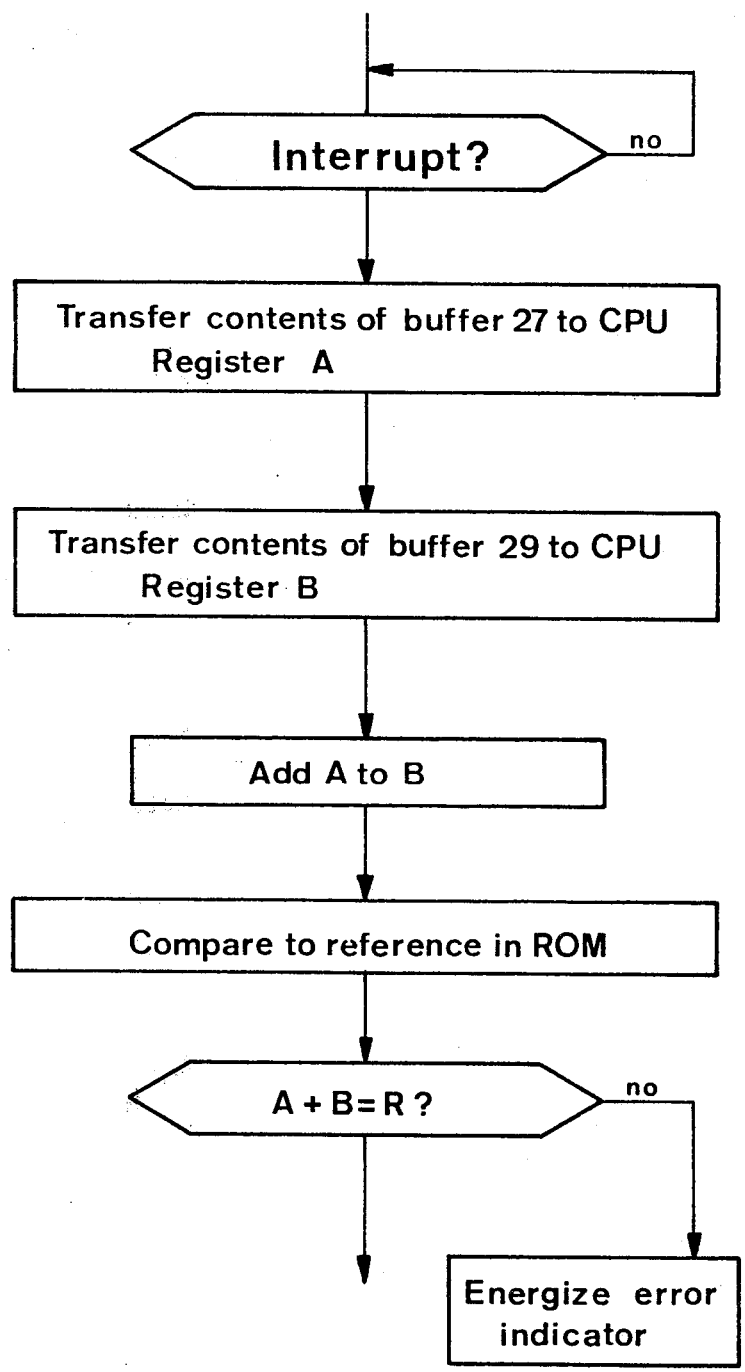
FIG. 4 is a flow chart for a microcomputer implementing the error detecting system of the present invention.

Leading edge 62 generates an interrupt signal which starts the program whose flow chart is given in FIG. 4: The contents of buffer storages 27 and 29, respectively, are transferred to the central processing unit at times corresponding to pulses 58 and 60 (FIG. 2), respectively. Microcomputer 30, which also operates in synchronism with clock generator 16, then forms the sum of the above-mentioned values. This sum is compared in the central processing unit to the predetermined number stored in read-only memory 34. If the sum and the value stored in the ROM are not the same, a signal is furnished to display control 42 which causes lamp 66 to light.

Buffer storages 27 and 29 are not absolutely essential, since the contents of counters 26 and 28 could be transferred to locations in the random access memory 40 rather than into the buffer storages. However, the use of the buffer storages results in some isolation between the microcomputer and the remainder of the circuitry and is therefore desirable.

It should also be noted that time interval 46 is a part of the predetermined time interval which starts at time T (FIG. 2). As previously mentioned, the time $T_o$ follows time T by 32 clock pulses; in particular, time $T_o$ occurs 12 clock pulses following the carry generated when counter 18 overflows.

In the embodiment illustrated herein, the comparison between the reference signal and the sum signal is carried out during each cycle, that is for each sawtooth. This has the advantage that any error will be found more rapidly and that the capacities of buffer storages 27 and 29 need only be very small. If a scale such as described in U.S. Pat. No. 3,786,884 is utilized wherein individual counts on counter 26 during a plurality of sequential cycles are summed to give the actual weight, then the comparison which is the subject of the present invention can be carried out after this summation has taken place and the so-formed signal has been added to a signal derived from summing the corresponding values stored in buffer storage 29. This latter method has the advantage that the summation over all the intervals is also checked. The various summing operations can be carried out external to, or within, the microcomputer.

As previously mentioned, it is also possible to transfer the count for one interval from counter 26 into RAM 40, transfer the count to the central processing unit and then directly add clock pulses to the value in the CPU.

This and all other above-described embodiments of the present invention may be used with any scale which generates a weight signal by counting up clock pulses generated during a weight-dependent part of a predetermined time interval.

While the invention has been illustrated in preferred embodiments, it is not to be limited to the circuits and structures shown, since many variations thereof will be evident to one skilled in the art and are intended to be encompassed in the present invention as set forth in the following claims.

We claim:

1. In a scale for weighing a load, said scale having clock signal generator means, first counting means connected to said clock signal generator means for counting said clock signals and furnishing a sequence of timing signals each signifying the start of a predetermined time interval comprising a predetermined number of clock signals, second counting means for counting said clock signals during a weight-dependent part of at least one of said predetermined time intervals and furnishing a weight signal corresponding to the so-counted number of clock signals, and means for storing said weight signal and furnishing a digital display thereof, an error detecting system comprising means connected to said clock signal generator means and said second counting means for adding the number of pulses generated in the remainder of said at least one predetermined time interval to said weight signal, thereby creating a sum signal, and for comparing said sum signal to a reference signal corresponding to said predetermined number of clock signals in said predetermined time interval; and means for furnishing an error signal when said sum signal is unequal to said reference signal.

2. Apparatus as set forth in claim 1, wherein said adding and comparing means comprises third counting means for counting signals applied thereto and furnishing counting output signals signifying the number of so-counted signals, switch means for applying said clock signals to said second and third counting means during said weight-dependent and said remaining part of said predetermined time interval respectively, and means for summing said weight signals and said counting output signals after the end of said predetermined time interval thereby creating said sum signal.

3. Apparatus as set forth in claim 1, wherein said adding and comparing means comprises the central processing unit of a microcomputer.

4. Apparatus as set forth in claim 3, wherein said microcomputer further comprises a read-only memory having at least one storage location for storing said predetermined number constituting said reference signal.

5. Apparatus as set forth in claim 4, wherein said central processing unit furnishes a comparator output signal when said sum signal is unequal to said reference signal; and wherein said error signal furnishing means comprises means operative in response to said comparator output signal for furnishing a visual or audible indication thereof.

\* \* \* \* \*